(12) United States Patent
Mikami

(10) Patent No.: US 7,019,878 B2
(45) Date of Patent: Mar. 28, 2006

(54) OPTICAL DEFLECTOR AND OPTICAL SCANNER HAVING THE OPTICAL DEFLECTOR

(75) Inventor: Keiichi Mikami, Iwatsuki (JP)

(73) Assignee: Fuji Xerox Co., Ltd., Tokyo (JP)

( * ) Notice: Subject to any disclaimer, the term of this patent is extended or adjusted under 35 U.S.C. 154(b) by 165 days.

(21) Appl. No.: 10/682,082

(22) Filed: Oct. 10, 2003

(65) Prior Publication Data

US 2004/0184128 A1    Sep. 23, 2004

(30) Foreign Application Priority Data

Mar. 19, 2003    (JP)    ............................... 2003-075803

(51) Int. Cl.
*G02B 26/08*    (2006.01)

(52) U.S. Cl. ...................... 359/216; 359/198
(58) Field of Classification Search ...................... None
See application file for complete search history.

(56) References Cited

U.S. PATENT DOCUMENTS 5,900,961 A * 5/1999 Miyamoto et al. .......... 359/196

6,449,107 B1 * 9/2002 Tachibe et al. ............. 359/819

FOREIGN PATENT DOCUMENTS

JP    6-75184    3/1994
JP    11-242177    9/1999

* cited by examiner

*Primary Examiner*—James Phan
(74) *Attorney, Agent, or Firm*—Morgan Lewis & Bockius LLP

(57) ABSTRACT

The present invention provides an optical deflector capable of reducing a rise in heat of integrated circuits and a housing without increasing noises caused by a wind sound of a rotative polygon mirror, and an optical scanner having the optical deflector. Heat in a lower face of an integrated circuit of a printed board can be allowed to escape by providing a through hole in a lower position of the integrated circuit. By bringing a radiating member into direct contact with the integrated circuit through the through hole, heat of the integrated circuit can be conducted to the radiating member and radiated. Therefore, a rise in a temperature of the housing can be reduced. As a result, life of a bearing can be prolonged and reliability of the integrated circuit can be increased.

5 Claims, 20 Drawing Sheets

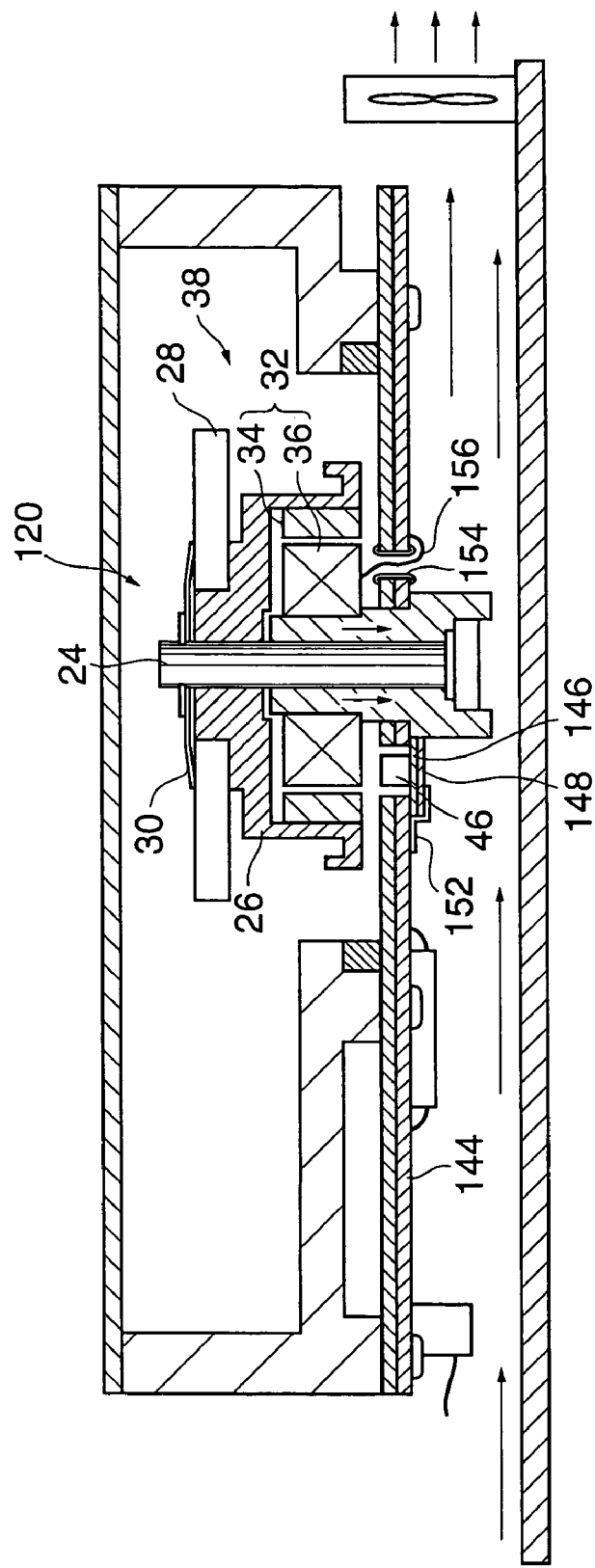

OPTICAL DEFLECTOR AND OPTICAL SCANNER HAVING THE OPTICAL DEFLECTOR

BACKGROUND OF THE INVENTION

1. Field of the Invention

The present invention relates to an optical deflector used in a laser printer and the like, and an optical scanner having the optical deflector.

2. Description of Related Art

FIG. 17 shows a general laser printer 200. As shown in FIGS. 17 and 18, an optical scanner 202 of box shape is disposed within the laser printer 200, and a light beam is emitted from a light source 204 disposed in a side wall of the optical scanner 202.

The light beam passes through a collimator lens 206, is reflected by one reflection face of a polygon mirror 214 constituting an optical deflector 212, and inputted to a surface of a photoconductive material 220 used as a drum-like recording medium via fθ lens 216 and cylindrical mirror 218, so that a latent image is formed on the photoconductive material 220.

As shown in FIG. 19, the optical deflector 212 is secured to the optical scanner 202 and a rotating body 222 including the polygon mirror 214 of the optical deflector 212 is rotatable. On the other hand, a printed board 224 constructed form a metal is secured to the optical scanner 202, and is provided with an integrated circuit 226 driving and controlling the rotating body 222.

A housing 228 of the optical scanner 202 is sealed with a cover 202A or the like to prevent contamination of optical lenses such as the fθ lens 216 (see FIG. 18) disposed in the optical scanner 202. However, it is often made of a material having a low thermal conductivity such as resin because of its low cost and constructionally has difficulty in expelling heat within the housing 228 to the outside.

A rise in the temperature of the housing 228 would exert a bad influence on not only the life of the bearing part 230 of the optical deflector 212 and the reliability of the integrated circuit 226 but also the optical lenses mounted in the housing 228.

Particularly, for optical lenses made of resin, since they have a high thermal expandability, a rise in temperatures would exert a great influence on them. Thermal deformation of the bottom wall of the housing 228 might change relative positional relationships among the light source 204, the optical deflector 212, and optical lenses such as the fθ lens 216, and the photoconductive material 220 as shown in FIG. 18 and deteriorate their optical properties.

A temperature distribution within the housing of the optical scanner is shown in FIG. 20. The temperature distribution within the housing shows that the surface temperature of the integrated circuit mounted on the printed board of the optical deflector is the highest, followed by the surface temperature of the rotation shaft of the optical deflector, and the surface temperature of optical lenses such as fθ lens.

Therefore, radiating a larger amount of heat of the integrated circuit of the optical deflector leads to reducing a rise in the temperature of the housing. A method of radiating heat generated by an integrated circuit on a printed board is described in Patent Reference 1. According to it, as shown in FIG. 21A, a radiating member 236 is brought into contact with the face of a printed board 232 on which an integrated circuit 234 is not mounted, a through hole 242 is formed in a bottom wall 240A of a housing 240 of an optical scanner 238, and the radiating member 236 is projected outside the housing 240 through the through hole 242, whereby heat of the integrated circuit 234 is radiated.

As another method, as shown in FIG. 21B, the radiating member 236 is mounted on an upper face of the integrated circuit 234 to radiate heat of the integrated circuit 234. According to Patent Reference 2, as shown in FIG. 21C, a radiating member 248 made to communicate with the outside of a housing 246 of an optical scanner 244 is brought into contact with a lower face of a printed board 250 and an upper face of an integrated circuit 252 to radiate heat of the integrated circuit 252 and the housing 246.

[Patent Reference 1]

Japanese Published Unexamined Patent Application No. Hei 6-75184

[Patent Reference 2]

Japanese Published Unexamined Patent Application No. Hei 11-242177

However, since laser printers are becoming higher in image quality and printing speeds are becoming faster, when a rotative polygon mirror is fast rotated to scan a laser beam on a photoconductive material, currents consumed by a rotating body and integrated circuits become larger in proportion to the speed of the rotating body as shown in FIG. 22, heat generated from an optical deflector increases, and the temperature of the housing of an optical scanner also rises.

On the other hand, a metallic printed board has an insulating film formed on a metallic board on which a wiring pattern is formed, and connects the wiring pattern and an integrated circuit by solder. Therefore, as shown in FIG. 21A, when the radiating member 236 is brought into contact with the face (back) of the printed board 232 on which the integrated circuit 234 is not mounted, an insulating film (not shown) intervenes between the integrated circuit 234 and the back of the printed board 232, so that heat of the integrated circuit 234 cannot be directly radiated.

In recent years, since miniaturization of an optical deflector has shortened the distance between an integrated circuit and a rotative polygon mirror, as shown in FIG. 21B, if the radiating member 236 is mounted on the upper face of the integrated circuit 234, the wind sound of the rotative polygon mirror 254 rotating fast becomes louder, so that the noise of an optical scanner 256 becomes a problem.

Furthermore, in recent years, small and flat integrated circuits are mounted on the surface of a printed board and are not structured to have a radiating member mounted therein. Therefore, in cases where a radiating member is secured by an adhesive having an excellent thermal conductivity, the thermal resistance of the adhesive and the time required until the radiating member has been secured become a problem.

On the other hand, although there is a method of using tightening members such as screws to mechanically tighten and secure a radiating member to an integrated circuit, holes for the tightening members must be provided on a printed board, so that a securing method becomes complicated and the printed board becomes large in size.

On the other hand, as shown in FIG. 21C, in cases where a radiating member 248 is made to communicate with the outside of the housing 246 of the optical scanner 244 and the radiating member 248 is brought into contact with the upper face of the integrated circuit 252, a method of securing the radiating member 248 and the integrated circuit 252 has the same problem. In addition, the large radiating member 248 is brought into contact with only the upper face of the integrated circuit 252 on the printed board 250 mounted in high density, and must be positioned while maintaining electrical insulation with other electronic parts (not shown) on the printed board 250. As a result, the radiating member 248 has a complicated positioning structure, which causes a rise in costs. Even if the radiating member 248 is flat in shape, it is inevitable that the wind sound of a rotative polygon mirror 258 rotating fast increases.

SUMMARY OF THE INVENTION

The present invention has been made in view of the above facts and provides an optical deflector capable of reducing a rise in the heat of integrated circuits and a housing without increasing noises caused by the wind sound of a rotative polygon mirror, and an optical scanner having the optical deflector.

According to an aspect of the present invention, an optical deflector includes: a motor that drives a rotative polygon mirror deflecting and scanning rays emitted from a light source; a drive circuit board, mounted in a housing, on which an electronic part such as an integrated circuit controlling the motor is mounted; a first through hole on a lower face of the electronic part, formed on the drive circuit board; and a radiating member that, through the first through hole, directly contacts the electronic part or indirectly contacts the electronic part through an intervening conductive member.

According to the above aspect, in the drive circuit board, a first through hole is formed on the lower face of the electronic part. Through the first through hole, the radiating member is brought into direct contact with the electronic part or into indirect contact with the electronic part through an intervening conductive member.

By thus forming the first through hole on the lower face of the electronic part, heat of the lower face of the electronic part can be expelled. By bringing the radiating member into contact with the electronic part through the first through hole, heat of the electronic part can be conducted to the radiating member through which the heat of the electronic part can be radiated.

Furthermore, since the radiating member is brought into contact with the electronic part through the first through hole formed on the lower face of the integrated circuit, the radiating member is not exposed to an upper portion of the drive circuit board, that is, a side in which a rotative polygon mirror is disposed. Therefore, bringing the radiating member into contact with the electronic part does not result in increased wind sound generated during the rotation of the rotative polygon mirror.

According to another aspect of the present invention, the drive circuit board is constructed from a metal, the rotative polygon mirror is on an upper face of the drive circuit board, and the electronic part is mounted on a lower face of the drive circuit board.

According to the above aspect, in the drive circuit board, the electronic part is mounted on a side opposite to the side in which the rotative polygon mirror is disposed. With this construction, the periphery of the motor becomes flattened on the side of the rotative polygon mirror of the drive circuit board, so that wind sound generated when wind generated by the rotation of the rotative polygon mirror hits the electronic part is weakened.

According to another aspect of the present invention, the rotative polygon mirror is on the upper face of the drive circuit board, and on the lower face of the drive circuit board, a first wiring pattern is formed and the electronic part is mounted; on the upper face of the drive circuit board, a second wiring pattern electrically connected with drive coils constituting the motor is formed and a position detector for detecting positions of drive magnets disposed to face the drive coils is disposed; and the first wiring pattern and the second wiring pattern are electrically connected by a connection hole formed on the drive circuit board.

According to the above aspect, the first wiring pattern is formed to mount the electronic part on the lower face of the drive circuit board that is on the opposite side of the rotative polygon mirror, and the second wiring pattern is formed to dispose the position detector on the upper face of the drive circuit board.

The drive circuit board is a so-called double-sided board between the upper and lower faces of which an insulating member is sandwiched. Accordingly, the connection hole is provided in the drive circuit board to electrically connect the first wiring pattern and the second wiring pattern.

According to another aspect of the present invention, on the lower face of the drive circuit board that is on the opposite side of the rotative polygon mirror, a first wiring pattern is formed and the electronic part is mounted; on the upper face of the drive circuit board, a second wiring pattern electrically connected with drive coils constituting the motor is formed and a subboard on which a position detector for detecting positions of drive magnets disposed to face the drive coils is disposed is secured; and the first wiring pattern and the second wiring pattern are electrically connected by a connection hole formed on the drive circuit board.

According to the present invention, on the lower face of the drive circuit board that is on the opposite side of the rotative polygon mirror, the first wiring pattern is formed and the electronic part is mounted. On the subboard, the second wiring pattern is formed and the position detector is disposed, and the subboard is secured to the upper face of the drive circuit board. The connection hole is formed on the drive circuit board, and the first wiring pattern and the second wiring pattern are electrically connected by the connection hole.

According to another aspect of the present invention, the optical deflector is provided.

According to the above aspect, by bringing the radiating member into contact with the electronic part through the first through hole, heat of the electronic part can be conducted to the radiating member through which the heat of the electronic part can be radiated. By forming the first through hole on the lower face of the integrated circuit as the electronic part and bringing the radiating member into contact with the integrated circuit through the first through hole, a rise in the temperature of the housing can be reduced. As a result, the life of a bearing constituting the motor can be prolonged and the reliability of the integrated circuit can be increased.

Since the radiating member is brought into direct contact with the integrated circuit, the radiation efficiency of the integrated circuit is excellent. Furthermore, by bringing the radiating member into contact with the drive circuit board, the first through hole is blocked by the radiating member and the optical scanner is kept sealed.

BRIEF DESCRIPTION OF THE DRAWINGS

Preferred embodiment of the present invention will be described in detail based on the followings, wherein:

FIG. 14 are partial enlarged views of the printed board of the optical scanner according to the fourth embodiment of the present invention.

FIG. 16 is a sectional view showing another example of the optical scanner according to the fourth embodiment of the present invention;

DESCRIPTION OF THE PREFERRED EMBODIMENTS

Hereinafter, an optical scanner of a first embodiment of the present invention is described.

Figure 1:
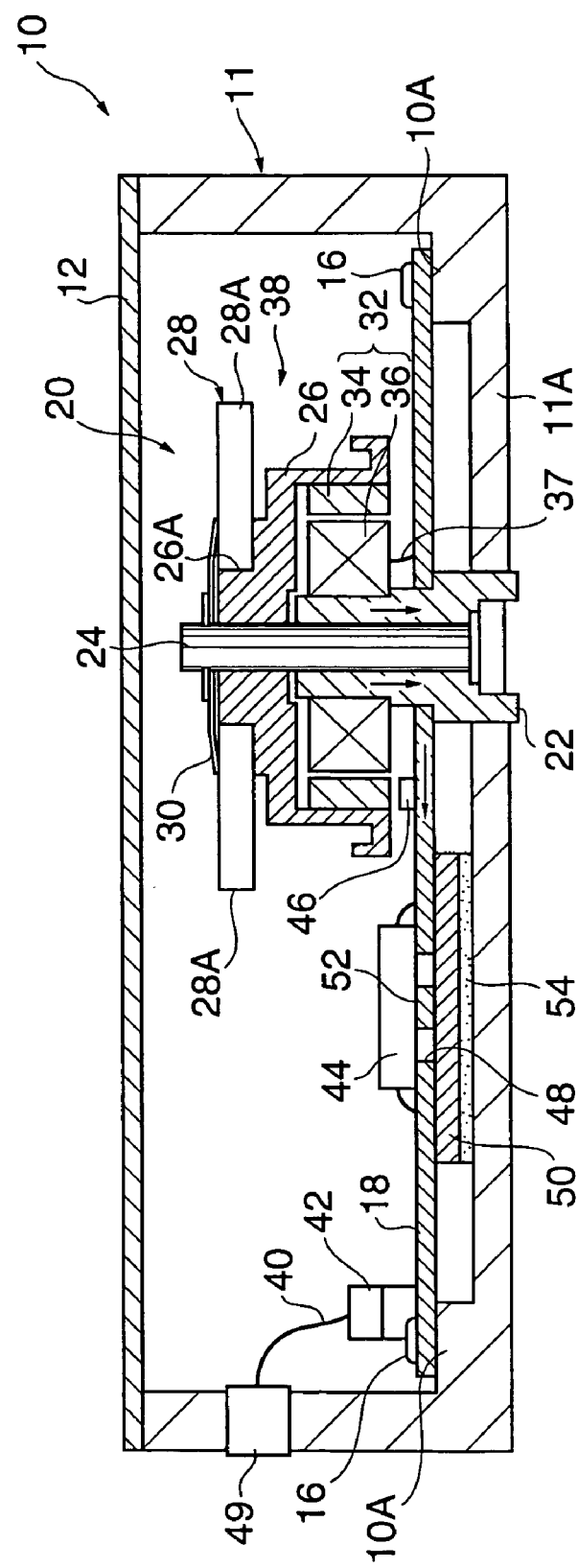
FIG. 1 is a sectional view shoving an optical scanner according to a first embodiment of the present invention.

FIG. 1 is a sectional view of an optical scanner 10, which is formed in box shape and substantially sealed with its opening covered with a cover 12. Seats 10A are projectingly mounted in the corners of a bottom wall 11a of a housing 11 of the optical scanner 10, and a metallic printed board 18 is secured by mounting screws 16.

A substantially cylindrical bearing 22 with a bottom constituting an optical deflector 20 penetrates through the printed board 18, and a rotation shaft 24 is fitted in the bearing 22 and rotatably supported.

A substantially tube-like rotation sleeve 26 is secured in an upper portion of the rotation shaft 24 and is rotatable integrally with the rotation shaft 24. In an upper portion of the rotation sleeve 26 is provided a small-diameter portion 26A, around which a polygon mirror 28 configured with plural mirrors 28A is fitted and secured to the rotation sleeve 26 by a ring-shaped securing member 30.

A lower portion of the rotation sleeve 26 is open, and drive magnets 34 are secured to inner wall faces of the rotation sleeve 26, wherein the drive magnets 34 are ring-shaped magnets that constitute a motor 32 and are magnetized with N and S poles to have different polarities from each other.

On the other hand, drive coils 36 are secured to the outer peripheral face of the bearing 22 in positions where they face the drive magnets 34, wherein the drive coils 36 have plural coils (not shown) and constitute the motor 32. The drive coils 36 are connected with a wiring pattern (not shown) formed on the printed board 18 through a signal line 37, and an exciting current flows to the drive coils 36 on the basis of a signal from a Hall device 46 (described later) serving as a position detector.

When an exciting current flows through the drive coil 36, a rotating body 38 (drive magnets 34, rotation sleeve 26, polygon mirror, and securing member 30) is rotated by induction magnetic forces with the drive magnets 34.

The printed board 18 has an insulating film and a wiring pattern formed on a metallic plate, and on the upper face (the wiring pattern side) of the printed board 18 are disposed an integrated circuit 44 of chip type in which a control circuit and a drive circuit integrally control excitation switching of the drive coils 36, and the Hall device 46 detecting the position of the rotating body 38.

Figure 2:
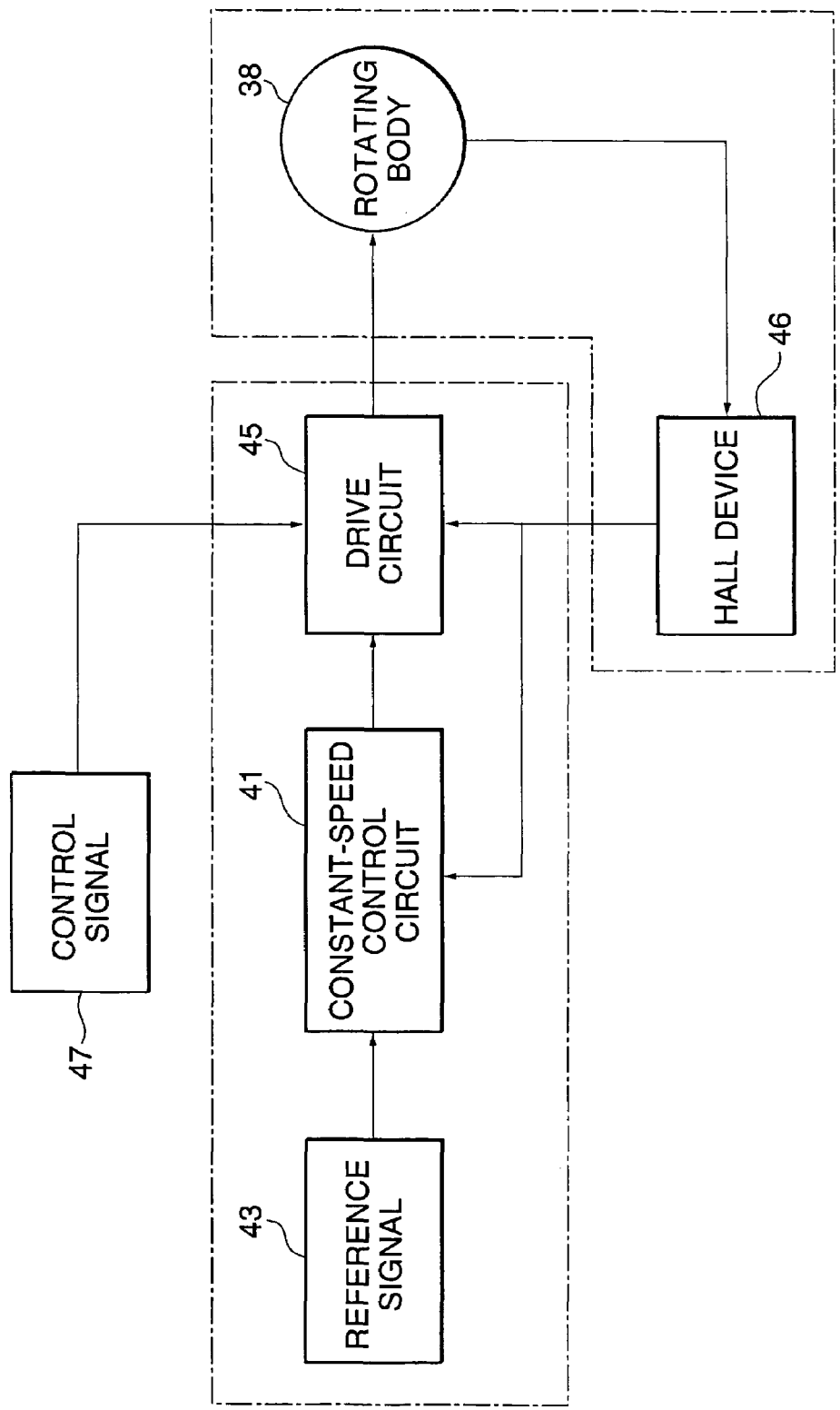
FIG. 2 is a block diagram showing a control circuit of an optical deflector of the optical scanner according to the first embodiment of the present invention.

As shown in FIG. 2, speed information of the rotating body 38, obtained from a signal of the Hall device 46, is fed back to a constant-speed control circuit 41 (PLL control) constituting the integrated circuit 44, the speed information and a reference signal 43 corresponding to a desired rotation speed are compared, and an exciting current making up for an error between them is fed to the drive circuit 45, whereby the rotating body 38 is rotated at a constant speed.

On the other hand, as shown in FIG. 1, an external connection part 42 is disposed on the upper face of the printed circuit 18. The external connection part 42 is connected with a relay part 49 disposed through a side wall of the housing 11 via a relay cable 40, and control signals 47 (see FIG. 2) for activating and stopping a power source disposed outside the optical scanner 10 and the rotating body 38 are transmitted to the external connection part 42.

The following gives a summary of the optical scanner of the first embodiment of the present invention.

As shown in FIG. 1, a through hole 48 smaller than the area of the integrated circuit 44 is provided in a lower position of the integrated circuit 44 of the printed board 18. A radiating member 50 larger than the area of the integrated circuit 44 is disposed so as to be contactable with a lower face of the printed board 18 in a lower position of the integrated circuit 44.

Figure 3:
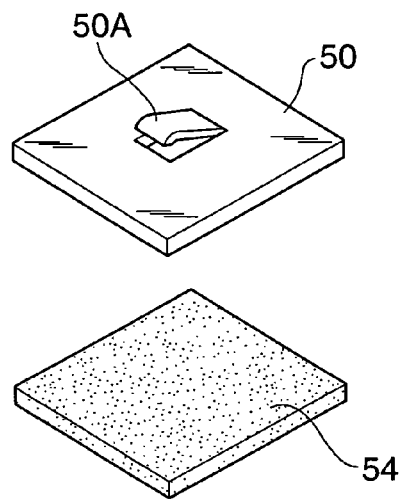
FIG. 3 is an exploded perspective view showing a method of securing a radiating member provided in the optical scanner according to the first embodiment of the present invention.

The radiating member 50 is constructed from materials having excellent thermal conductivity such as aluminum, copper, and phosphorus bronze. As shown in FIG. 3, a raised portion 50A provided with spring properties by cutting and raising a part of the radiating member 50 is projected from the upper face of the radiating member 50.

With this construction, as shown in FIG. 1, when the radiating member 50 is brought into contact with the back of the printed board 18, the raised portion 50A can be brought into direct contact with the integrated circuit 44 through the through hole 48.

Between the radiating member 50 and a bottom wall 11A of the housing 11 of the optical scanner 10, as shown in FIG. 3, an elastic member 54 having substantially the same area as the radiating member 50 is disposed. The elastic member 54 is constructed from an expandable resin, silicon rubber, and the like, and is elastically deformable.

The elastic member 54 is thicker than a clearance produced between the radiating member 50 and the bottom wall 11A of the housing 11. As shown in FIG. 1, with the elastic member 54 and the radiating member 50 disposed on the bottom wall 11A of the housing 11, if the printed board 18 is secured to the seats 10A by mounting screws 16, the elastic member 54 is compressed and the radiating member 50 is pressed toward the printed board 18 by the elastic member 54.

As a result, the radiating member 50 contacts the lower face of the printed board 18 without fail, and the raised portion 50A of the radiating member 50 contacts the integrated circuit 44 without fail.

The following describes the operation of the optical scanner of the first embodiment of the present invention.

As shown in FIG. 1, although the optical scanner 10 is sealed with the housing 11 of box shape covered with the cover 12, heat in the lower face of the integrated circuit 44 of the printed board 18 can be allowed to escape by providing the through hole 48 in a lower position of the integrated circuit 44.

By bringing the radiating member 50 into direct contact with the integrated circuit 44 through the through hole 48, heat of the integrated circuit 44 can be conducted to the radiating member 50 and radiated.

Figure 20:
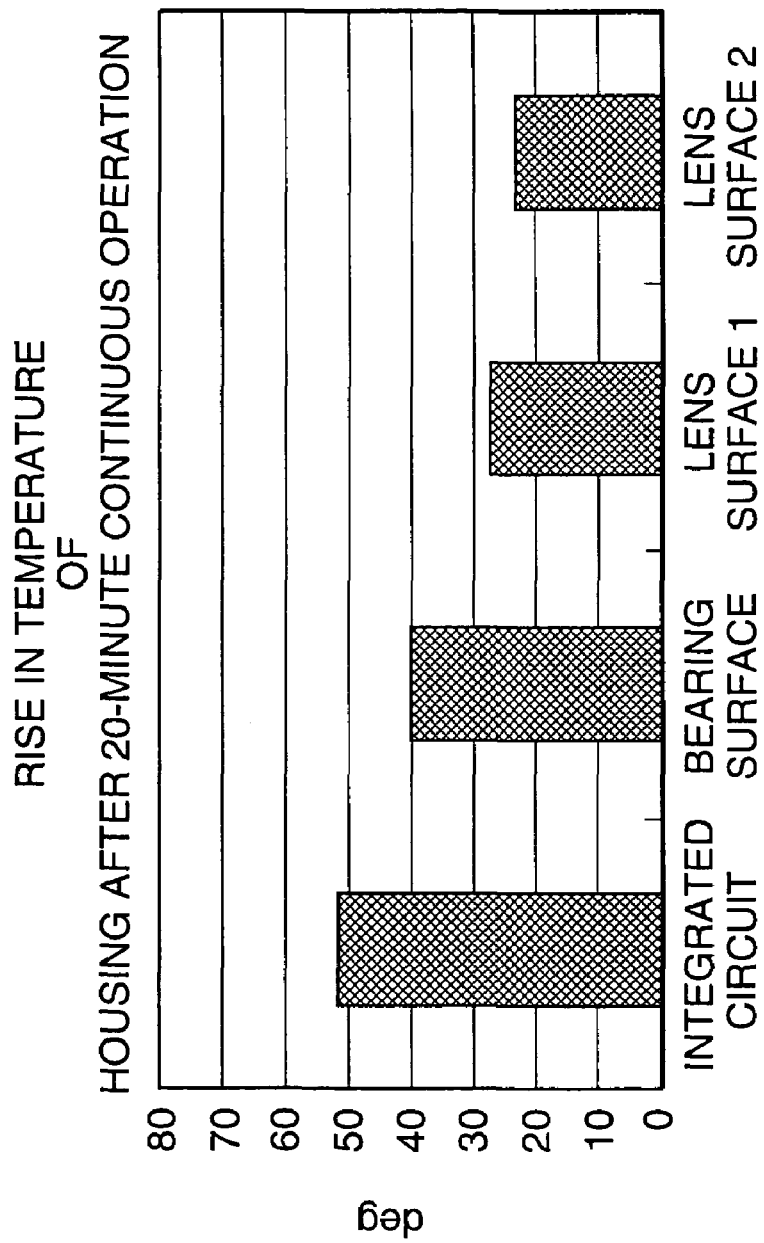
FIG. 20 is a graph showing a rise in temperatures within a housing.
Figure 21A:
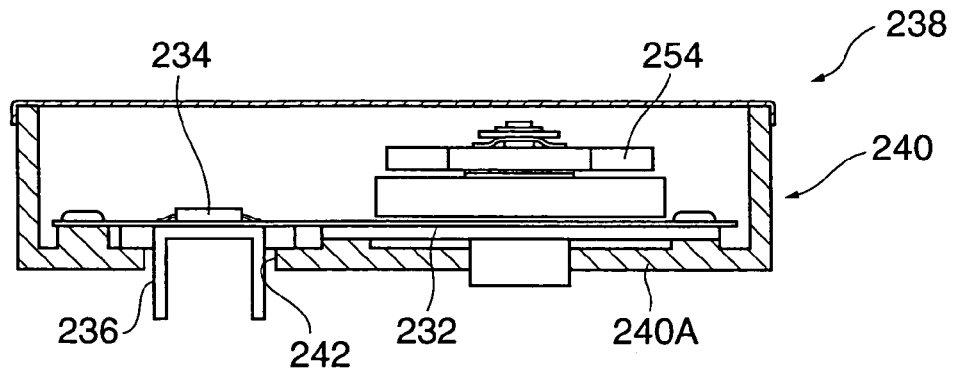
FIGS. 21A to 21C are sectional views showing conventional optical scanners.
Figure 21B:
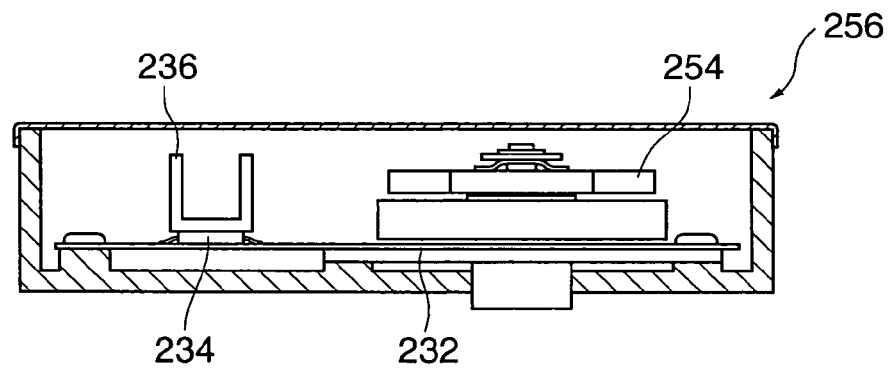
Figure 21C:
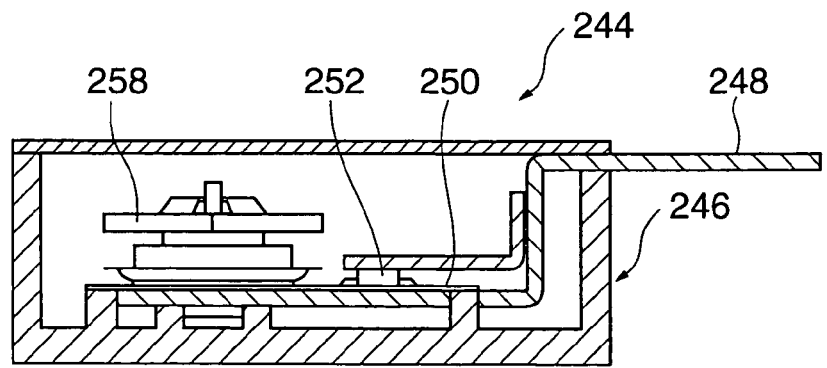
Figure 22:
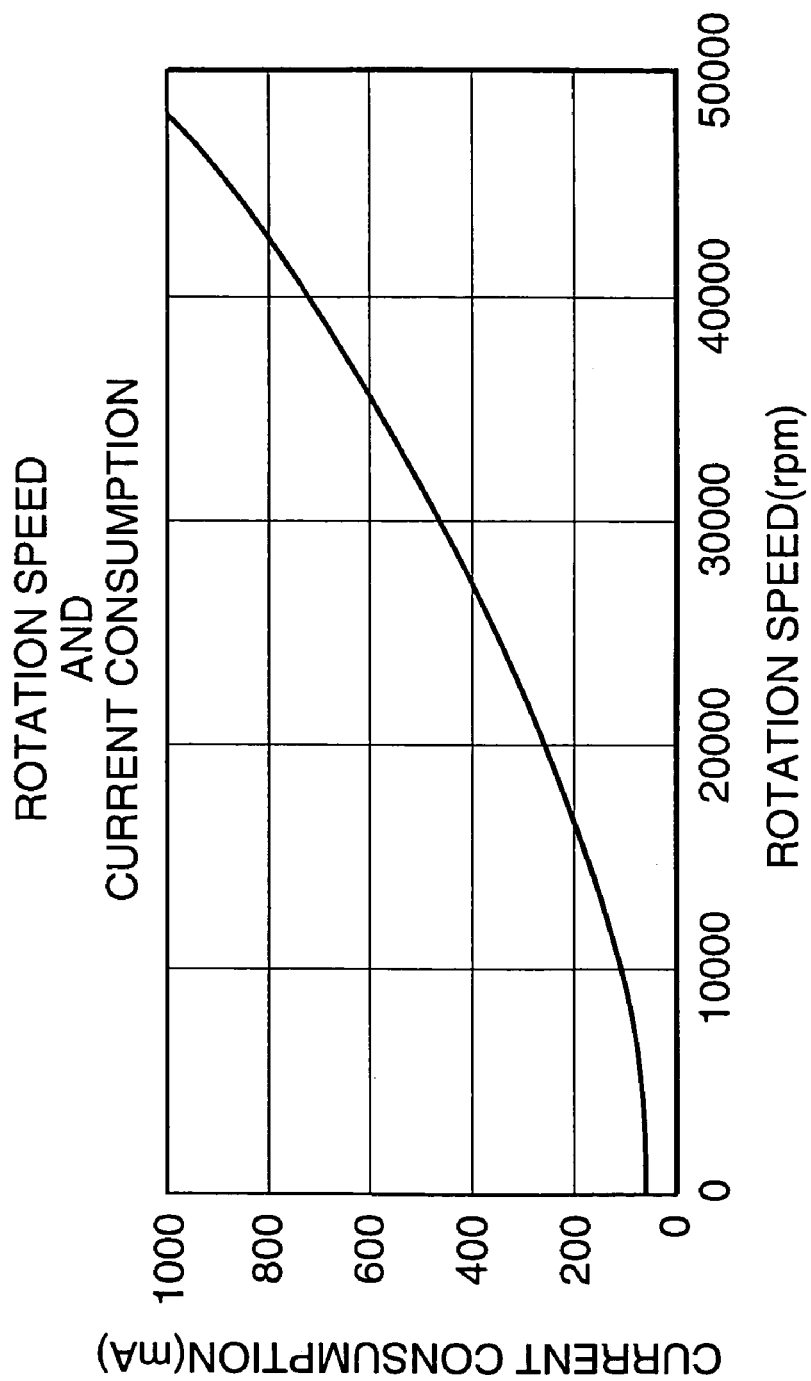
FIG. 22 is a graph shoving a relationship between rotation speeds and current consumptions.

As shown in FIG. 20, since surface temperature of the integrated circuit becomes highest within the housing of the optical scanner, a rise in the temperature of the housing can be reduced by increasing the heat radiation capability of the integrated circuit.

Therefore, as shown in FIG. 1, by forming the through hole 48 in the lower face of the integrated circuit 44 and bringing the radiating member 50 into contact with the integrated circuit 44 through the through hole 48, a rise in the temperature of the housing 11 can be reduced. As a result, the life of the bearing 22 can be prolonged and the reliability of the integrated circuit 44 can be increased. Moreover, the direct contact of the radiating member 50 with the integrated circuit 44 provides excellent heat radiation efficiency for the integrated circuit 44.

Since the radiating member 50 is brought into contact with the integrated circuit 44 through the through hole 48 formed in a lower position of the integrated circuit 44, the radiating member 50 is not exposed to the upper side of the printed board 18, that is, the side where the polygon mirror 28 is disposed. Therefore, bringing the radiating member 50 into contact with integrated circuit 44 causes no increase in wind sound generated during rotation of the polygon mirror 28.

On the other hand, by constructing the printed board 18 from metals and bringing the radiating member 50 into contact with the lower face of the printed board 18, heat generated by the motor 32 can be conducted to the radiating member 50 through the printed board 18 for heat radiation.

As the raised portion 50A, a conduction member different from the radiating member 50 may be used; it may be constructed from, e.g., phosphorus bronze that has excellent thermal conductivity and spring properties.

Figure 4:
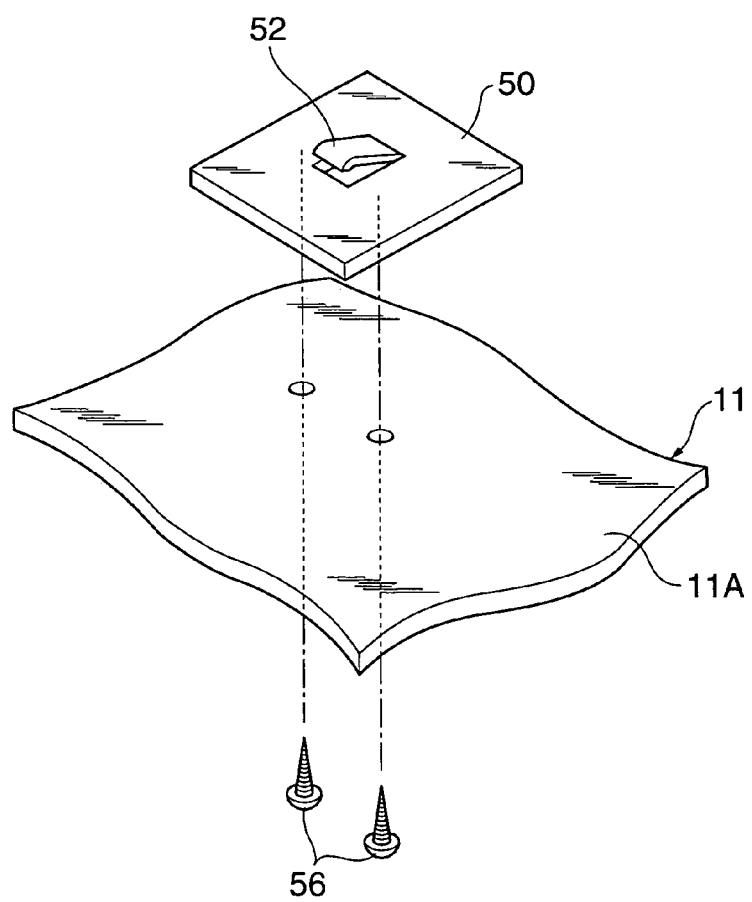
FIG. 4 is an exploded perspective view showing another method of securing the radiating member provided in the optical scanner according to the first embodiment of the present invention.

In place of the elastic member 54 used in this embodiment, any member may be used which never fails to bring the radiating member 50 into contact with the lower face of the printed board 18. For example, as shown in FIG. 4, screws 56 may be screwed to the lower face of the bottom wall 11A of the housing 11 of the optical scanner 10 so that the radiating member 50 is secured to the bottom wall 11A of the housing 11, with the radiating member 50 pressed against the printed board 18 (see FIG. 1) by the screws 56.

In this embodiment, as shown in FIG. 1, the through hole 48 is formed in the lower face of the integrated circuit 44. However, the present invention is not limited to the integrated circuit 44; also for other electronic parts on the printed board 18 that generate heat, a through hole may be provided on the lower faces of the electronic parts to bring the electronic parts into contact with the radiating member.

The following gives a summary of the optical scanner of a second embodiment of the present invention. Almost the same contents as the first embodiment will be omitted from the following discussion.

Figure 5:
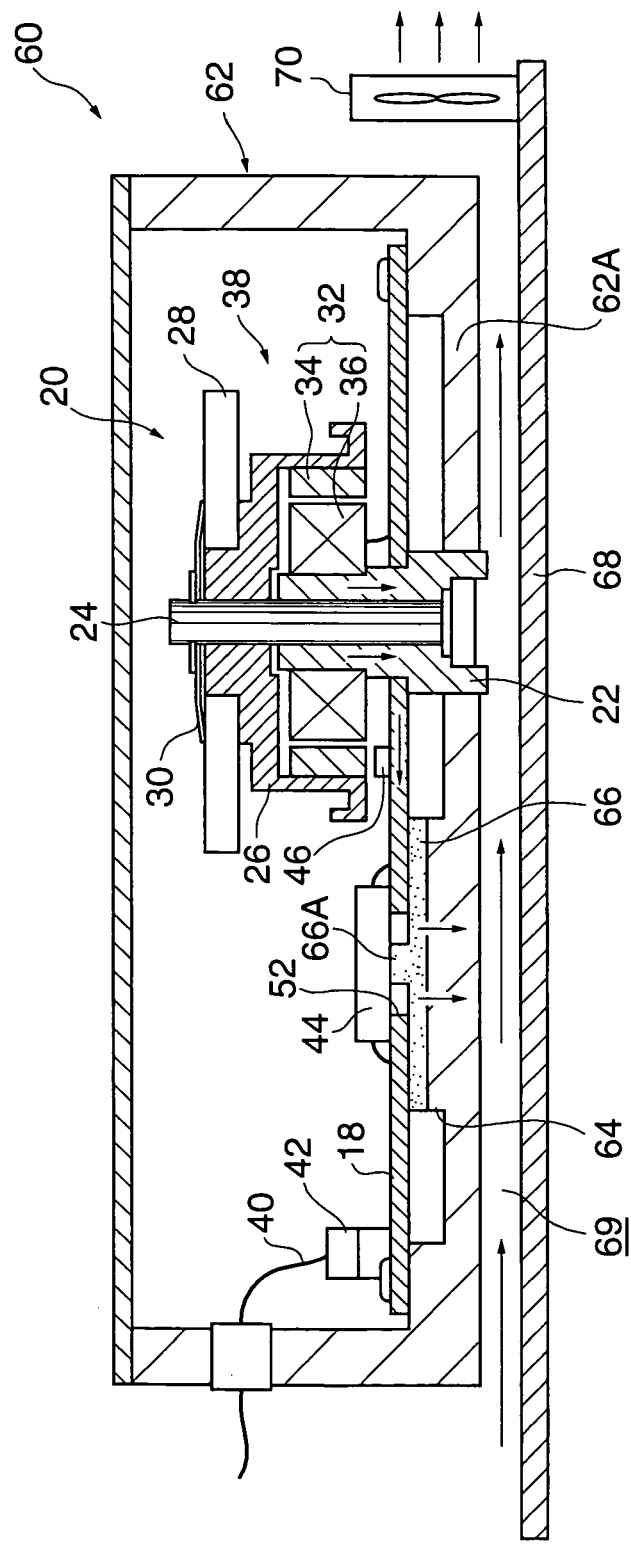
FIG. 5 is a sectional view showing an optical scanner according to a second embodiment of the present invention.

An optical scanner 60 shown in FIG. 5 has a housing 62 constructed form a metal such as aluminum, sheet metal, magnesium, wherein a bottom wall 62A of the housing 62 serves as a radiating member. Specifically, with the printed board 18 secured to the housing 62, a substantially rectangular seat 64 is projectingly mounted in a bottom wall 62A of the housing 62 in a lower position of the integrated circuit 44 mounted on the printed board 18.

A clearance is provided between the upper face of the seat 64 and the printed board 18, and a silicon rubber 66 having a high thermal conductivity is embedded in the clearance. The silicon rubber 66 is of rectangular shape and has a touching part 66A projected in its center, wherein the touching part 66A allows passage of the through hole 48.

The silicon rubber 66 is thicker than the clearance and the height of the touching part 66A is slightly greater than the thickness of the printed board 18. Since the silicon rubber 66 is elastically deformable, if the printed board 18 is secured to the housing 62 in a state in which the silicon rubber 66 is secured to the upper face of the seat 64 of the housing 62, the silicon rubber 66 is compressed, ensuring contact among the printed board 18, the integrated circuit 44, and the housing 62 through the silicon rubber 66.

On the other hand, a clearance 69 is provided between a mount 68 provided in a laser printer and the back of the optical scanner 60, and the mount 68 is provided with a fan 70. This allows lower air of the optical scanner 60 to flow in one direction.

The following describes the operation of the optical scanner of the second embodiment of the present invention.

As shown in FIG. 5, by making the housing 62 itself of the optical scanner 60 a radiating member, heat generated by the integrated circuit 44 is radiated to the outside through the silicon rubber 66 and the seat 64.

Heat within the housing 62 generated by the motor 32 can be radiated through the printed board 18, the silicon rubber 66, and the seat 64. Therefore, without using a special radiating member, a rise in the temperature in the integrated circuit 44 and the housing 62 can be reduced.

Furthermore, by providing the clearance 69 between the mount 68 provided in the laser printer and the back of the optical scanner 60, and providing the mount 68 with a cooling unit such as the fan 70, air outside the housing 69 is allowed to flow to the clearance 69 and the bottom wall 62A of the housing 62 is cooled, and heat radiated by the housing 62 is allowed to flow in a direction that moves away from the optical scanner 60 through the clearance 69. As a result, the temperature in the integrated circuit 44 and the housing 62 can be further reduced.

Although, in this embodiment, the silicon rubber 66 is provided between the printed board 18 and the housing 62, a spring member constructed from phosphorus bronze having spring properties may be used in place of the silicon rubber 66.

The following gives a summary of the optical scanner of the third embodiment of the present invention. Almost the same contents as the first embodiment will be omitted from the following discussion.

Figure 6:
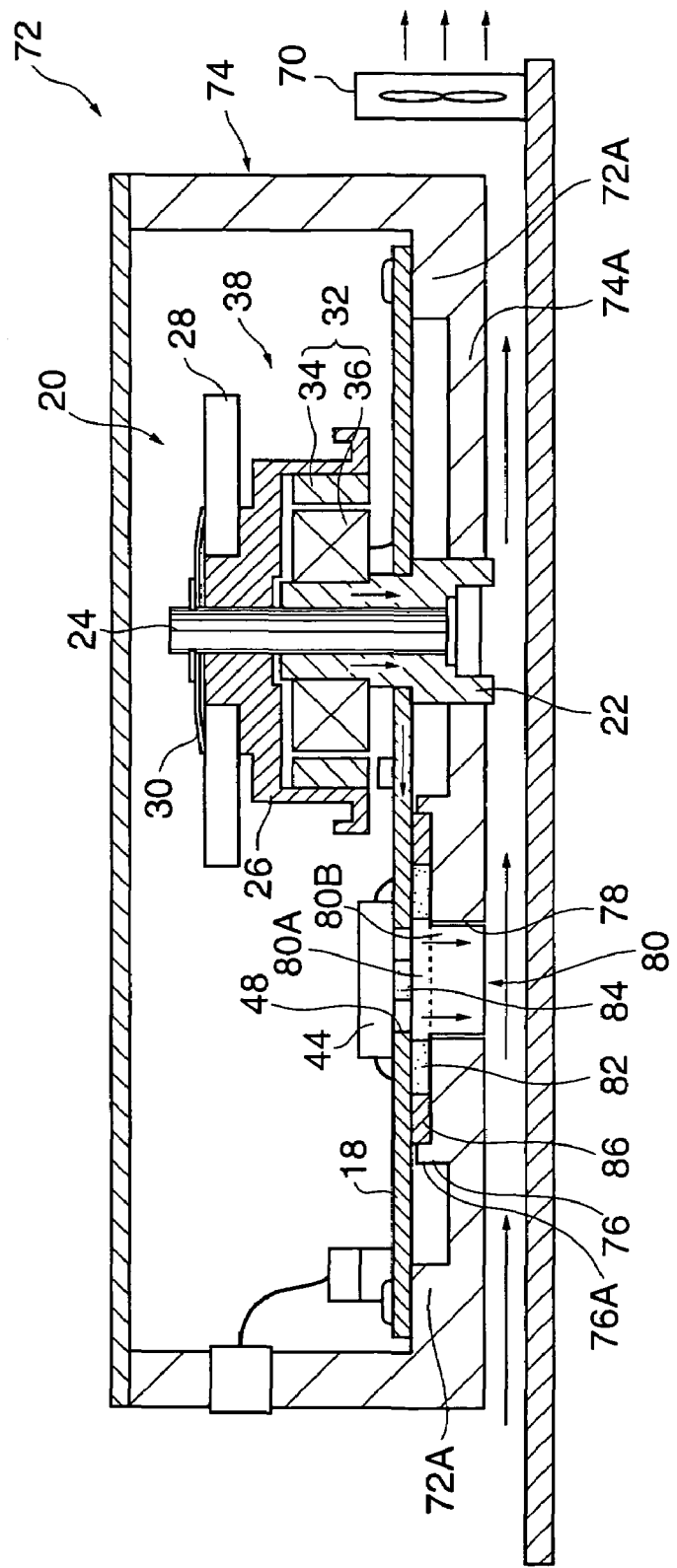
FIG. 6 is a sectional view showing an optical scanner according to a third embodiment of the present invention.

As shown in FIG. 6, in a bottom wall 74A of a housing 74, of an optical scanner 72, a mounting part 76 of substantially rectangular shape is projectingly mounted in a position corresponding to the integrated circuit 44 mounted on the printed board 18 secured to the housing 74. A through hole 78 is provided in a central portion of the mounting part 76 that corresponds to the through hole 48 provided in a lower position of the integrated circuit 44, and the through hole 48 and the through hole 78 are made to communicate with each other.

Figure 7:
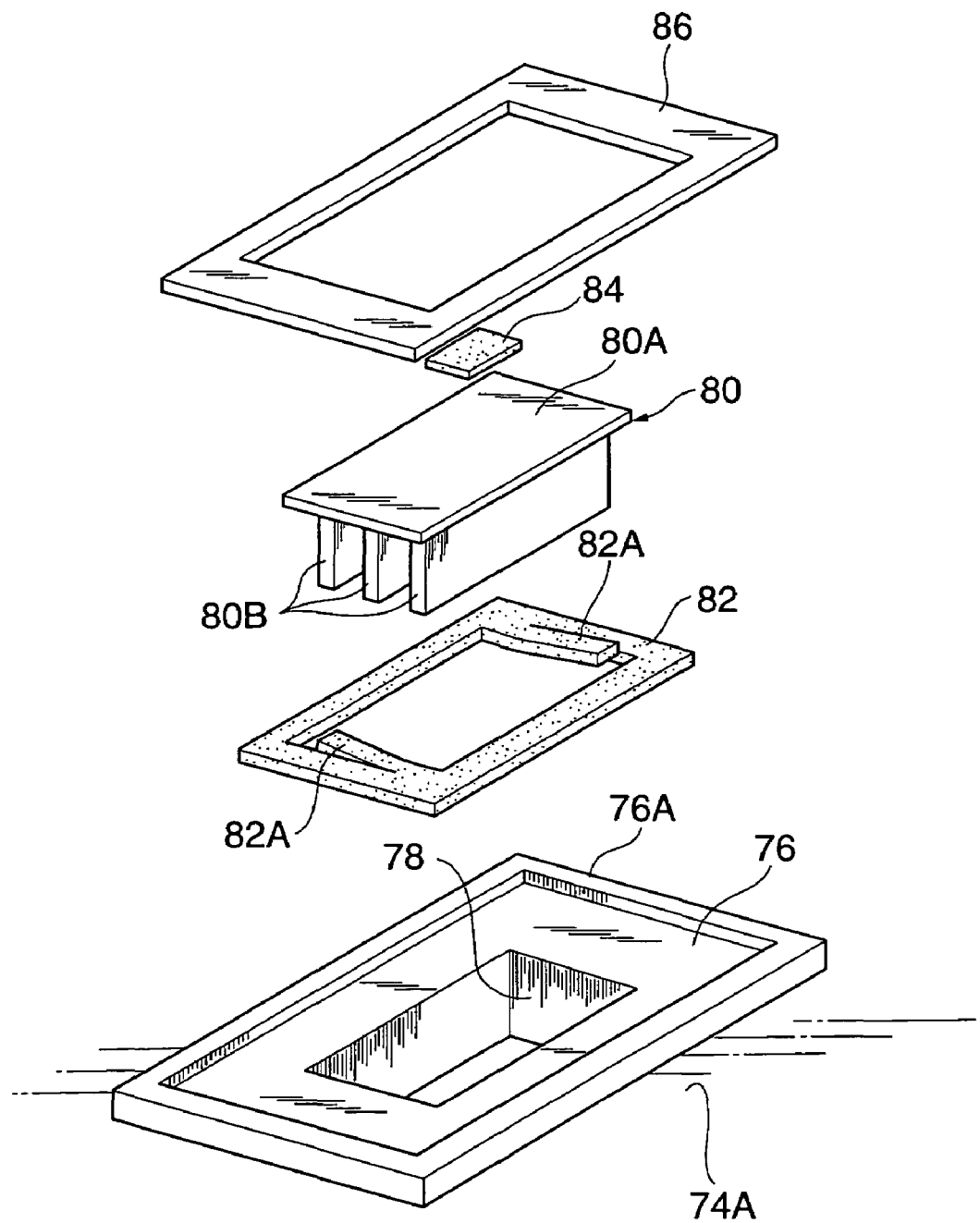
FIG. 7 is an exploded perspective view showing a method of securing a radiating member provided in the optical scanner according to the third embodiment of the present invention.

As shown in FIGS. 6 and 7, in the outer edge of the mounting part 76, an outer wall 76A is erected at a predetermined distance from the through hole 78 so that it is slightly lower than the height of a seat 72A projectingly mounted in a corner of the bottom wall 74A of the housing 74.

On the other hand, a radiating member 80 has a rectangular flange 80A in an upper portion thereof whose size allows touch with the outer edge of the through hole 78. From the lower face of the flange 80A, with clearances from the outer edge of the flange 80A, three ribs 80B are downward projected in a direction of the width of the flange 80A and elongated in a longitudinal direction. The three ribs 80B can be inserted in the through hole 78.

By the way, in the outer edge of the through hole 78 is disposed a rectangular elastic member 82 constructed from a silicon rubber or the like. The elastic member 82 is provided with raised portions 82A in a direction of the width of the elastic member 82, with their tips overhanging from the upper face of the elastic member 82.

The radiating member 80 is disposed on the upper face of the elastic member 82. An elastic member 84 is secured on the upper face of the radiating member 80, wherein the elastic member 84 has such a size as to allow passage of the through hole 48 and is thicker than the printed board 18.

The elastic member 82 is designed so that, with the printed board 18 secured to the seats 72A, the height of the radiating member 80 disposed on the elastic member 82 is higher than a clearance between the printed board 18 and the upper face of the mounting part 76.

On the other hand, outside the elastic member 82 is disposed a rectangular seal member 86 constructed from an expandable resin, silicon rubber, and the like, wherein seal member 86 has an external dimension substantially equal to the internal dimension of the outer wall 76A.

The following describes the operation of the optical scanner of the third embodiment of the present invention.

As shown in FIG. 6, the mounting part 76 is projectingly mounted in the bottom wall 74A of the housing 74 and provided with the through hole 78 corresponding to the through hole 48. By inserting the ribs 80B of the radiating member 80 in the through hole 78, the ribs 80B are exposed to outside the housing 74.

With this construction, heat generated from the integrated circuit 44 and the motor 32 can be radiated to outside the housing 74 through the radiating member 80. Therefore, a rise in the temperature in the integrated circuit 44 and the housing 74 can be reduced.

With the printed board 18 secured to the seats 72A, the height of the radiating member 80 disposed on the elastic member 82 is higher than a clearance between the printed board 18 and the upper face of the mounting part 76, and the elastic member 84 is formed so as to be thicker than the printed board 18.

With this construction, when the printed board 18 is secured to the seats 72A, the elastic member 82 is compressed and the radiating member 80 is pressed against the printed board 18, never failing to bring the radiating member 80 into contact with the lower face of the printed board 18 and never failing to bring the integrated circuit 44 into contact with the radiating member 80 through the elastic member 84.

By covering the outside of the elastic member 82 with the seal member 86, noises of the optical deflector 20 can be reduced and the invasion of dusts into the housing 74 can be prevented.

The present invention is not limited to the above-described embodiment so long as the through hole 78 corresponding to the through hole 48 provided in the printed board 18 is provided in the bottom wall 74A of the housing 74 and the radiating member 80 can be exposed to outside the housing 74 through the through hole 78.

Figure 8:
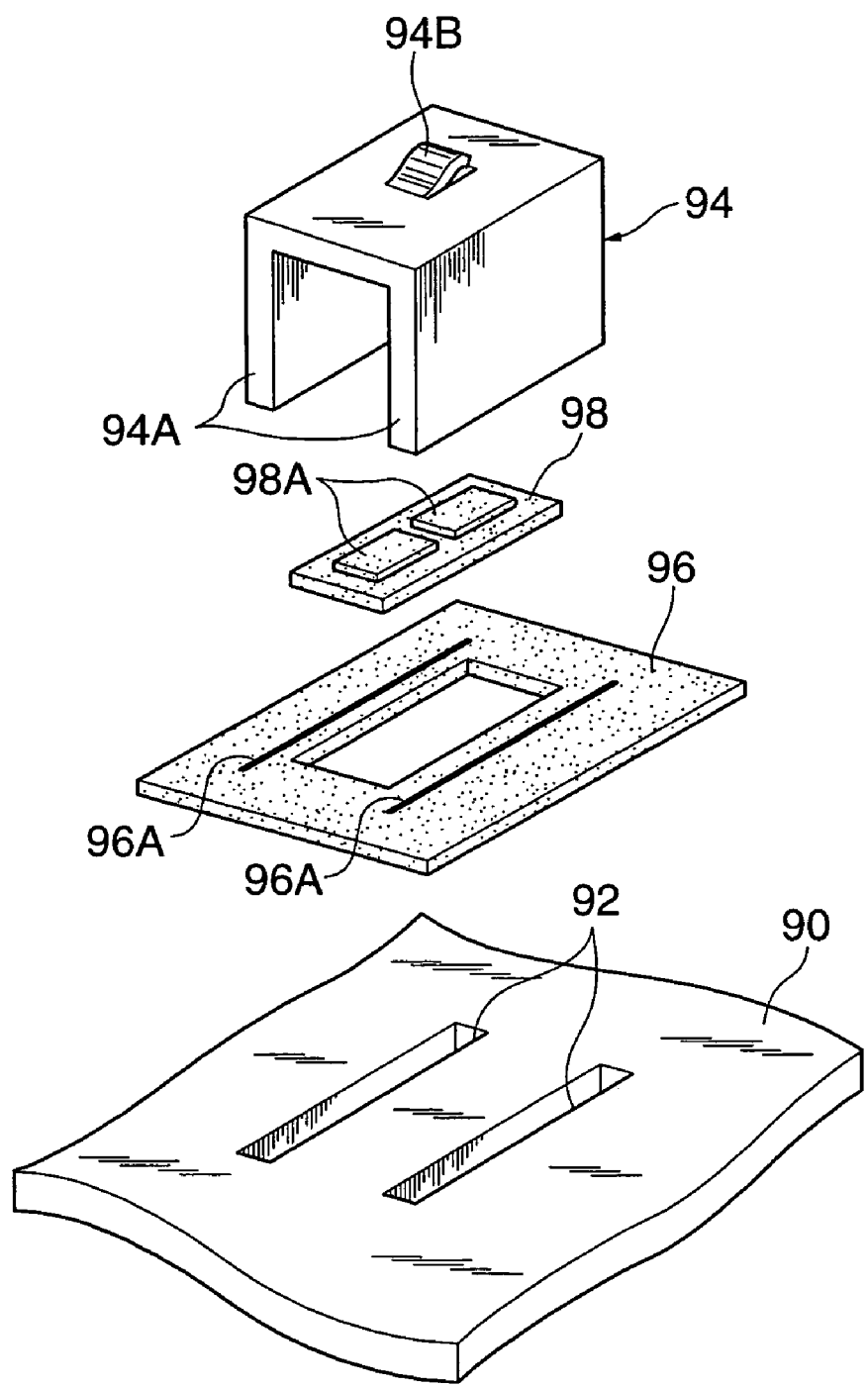
FIG. 8 is an exploded perspective view showing another method of securing the radiating member provided in the optical scanner according to the third embodiment of the present invention.

For example, the following alternative may be provided, as shown in FIG. 8, for the through hole 78 provided in the mounting part 76 projectingly mounted in the bottom wall 74A of the housing 74; a pair of long holes 92 are formed, a radiating member 94 is bent in the shape of U, and legs 94A thereof are passed through the long holes 92 so as to be exposed to outside the housing 74 (see FIG. 6).

The following alternative may be provided, as shown in FIG. 7, for the elastic member 84 secured to the upper face of the radiating member 80; as shown in FIG. 8, a raised portion 94B is projected from the upper face of the radiating member 94 and touched with the integrated circuit 44 (see FIG. 6) through the through hole 48 (see FIG. 6).

Between the radiating member 94 and the mounting part 90 is disposed a rectangular seal member 96 constructed from an expandable resin, silicon rubber, and the like, wherein the seal member 96 is larger than the area of the upper face of the radiating member 94.

The seal member 96 is provided with passage parts 96A corresponding to the mounting part 90, wherein, since the passage parts 96A place an emphasis on the sealing of the long holes 92, they are narrower in width than the legs 94A of the radiating member 94, and are forcibly widened when the legs 94A are passed.

A flat elastic member 98 is disposed in an opening of the seal member 96. Projected portions 98A are provided on the upper face of the elastic member 98 and projected therefrom to bring the radiating member 94 into contact with the mounting part 90 through the elastic member 98 without fail.

In this embodiment, the elastic member 98 is disposed in the mounting part 90, the seal member 96 is disposed on the periphery of the elastic member 98, and the radiating member 94 is disposed on the upper faces of the elastic member 98 and the seal member 96. However, if the radiating member 94 can be brought into contact with the lower face of the printed board 18, noises in the optical deflector 20 can be reduced, and the invasion of dusts into the housing 74 can be prevented, the elastic member 98 and the seal member 96 may not necessarily be disposed between the radiating member 94 and the mounting part 90.

Figure 9:
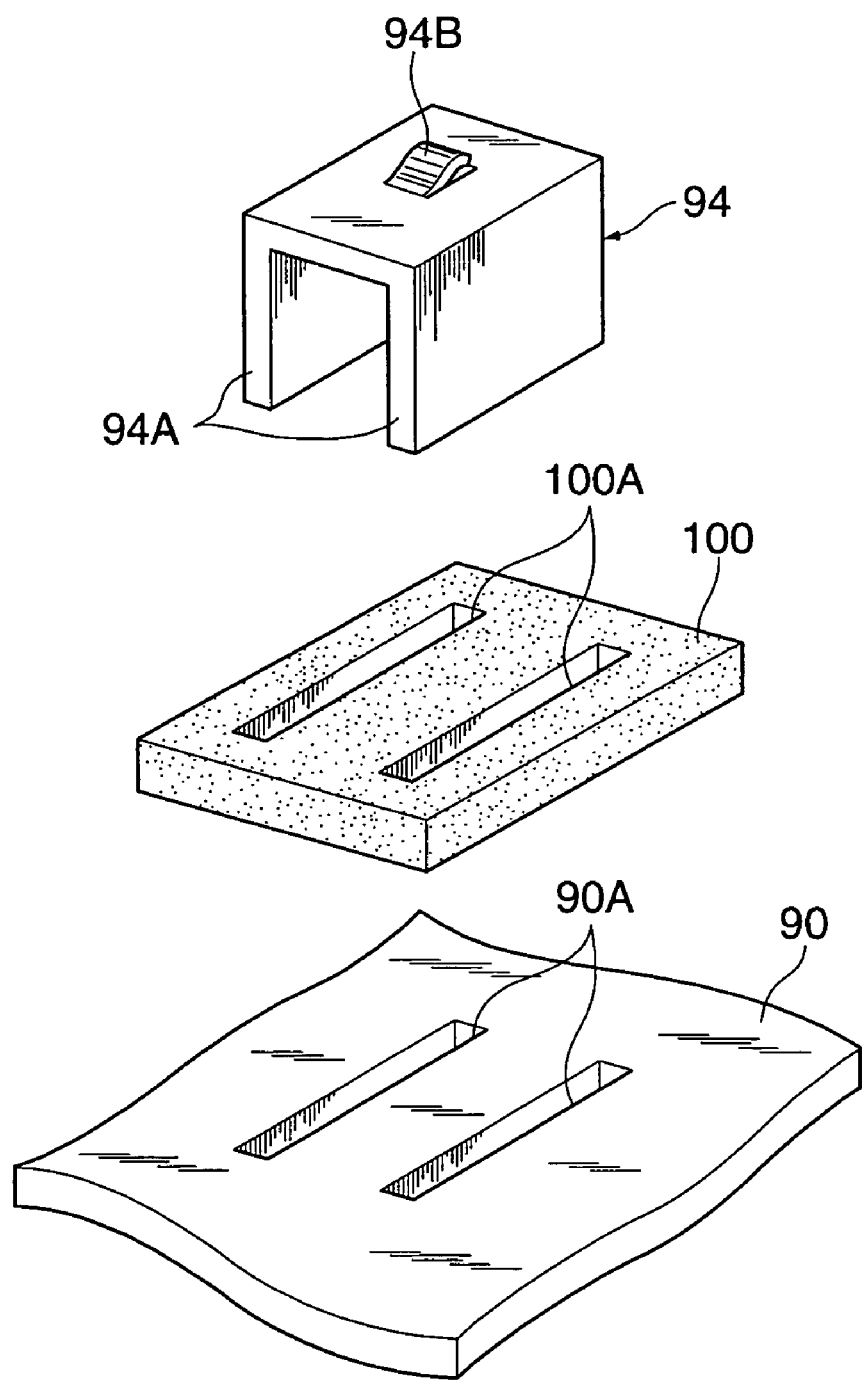
FIG. 9 is an exploded perspective view showing another method of securing the radiating member provided in the optical scanner according to the third embodiment of the present invention.

For example, as shown in FIG. 9, only an elastic member 100 may be disposed between the radiating member 94 and the mounting part 90. In this case, the elastic member 100 is provided with passage holes 100A through which the legs 94A of the radiating member 94 can be passed. With the elastic member 100 disposed in the mounting part 90, the legs 94A of the radiating member 94 are passed through the passage holes 100A and long holes 90A to bring the radiating member 94 into contact with the mounting part 90 through the elastic member 100.

Figure 10:
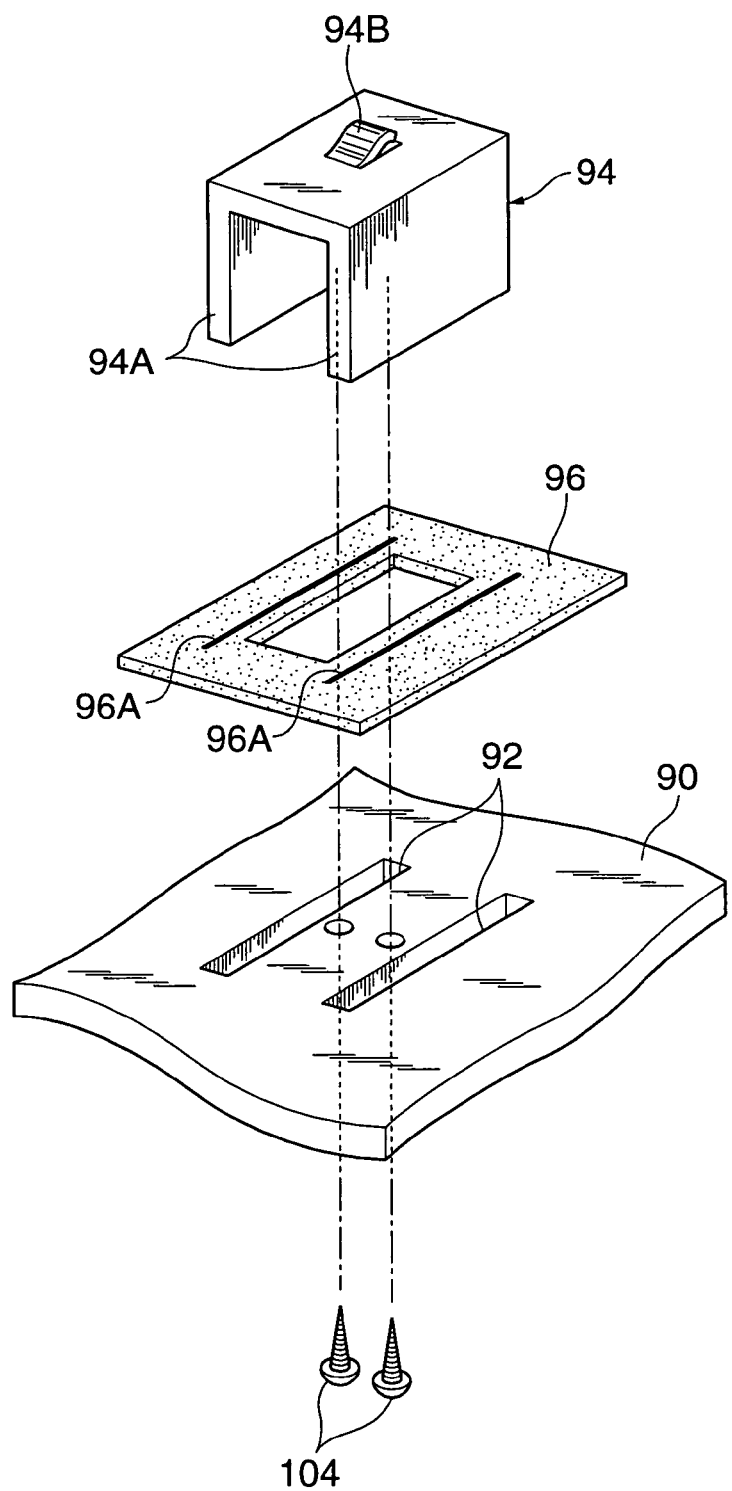
FIG. 10 is an exploded perspective view showing another method of securing the radiating member provided in the optical scanner according to the third embodiment of the present invention.

As shown in FIG. 10, only the seal member 96 may be disposed between the radiating member 94 and the mounting part 90. The radiating member 94 may be positioned in a vertical direction by mounting screws 104.

The following gives a summary of an optical scanner of a fourth embodiment of the present invention. Almost the same contents as the first embodiment will be omitted from the following discussion.

Figure 11:
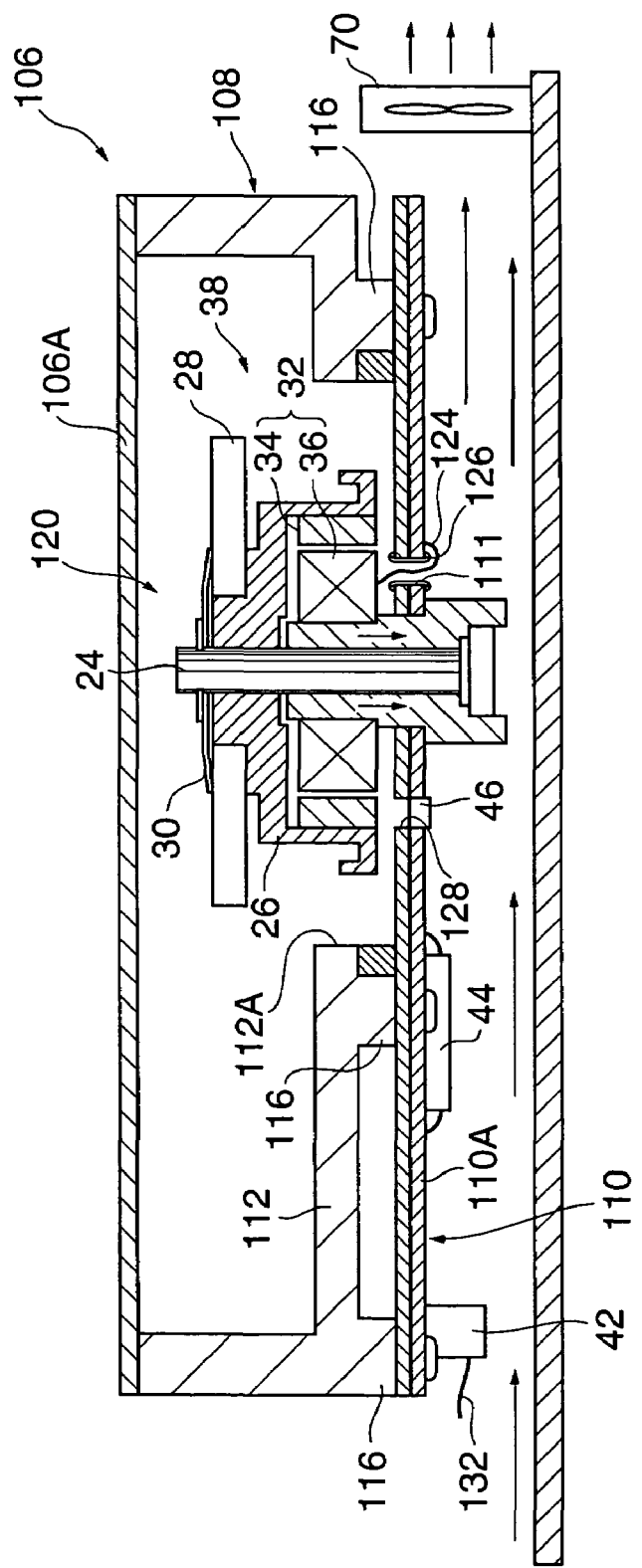
FIG. 11 is a sectional view showing an optical scanner according to a fourth embodiment of the present invention.
Figure 12:
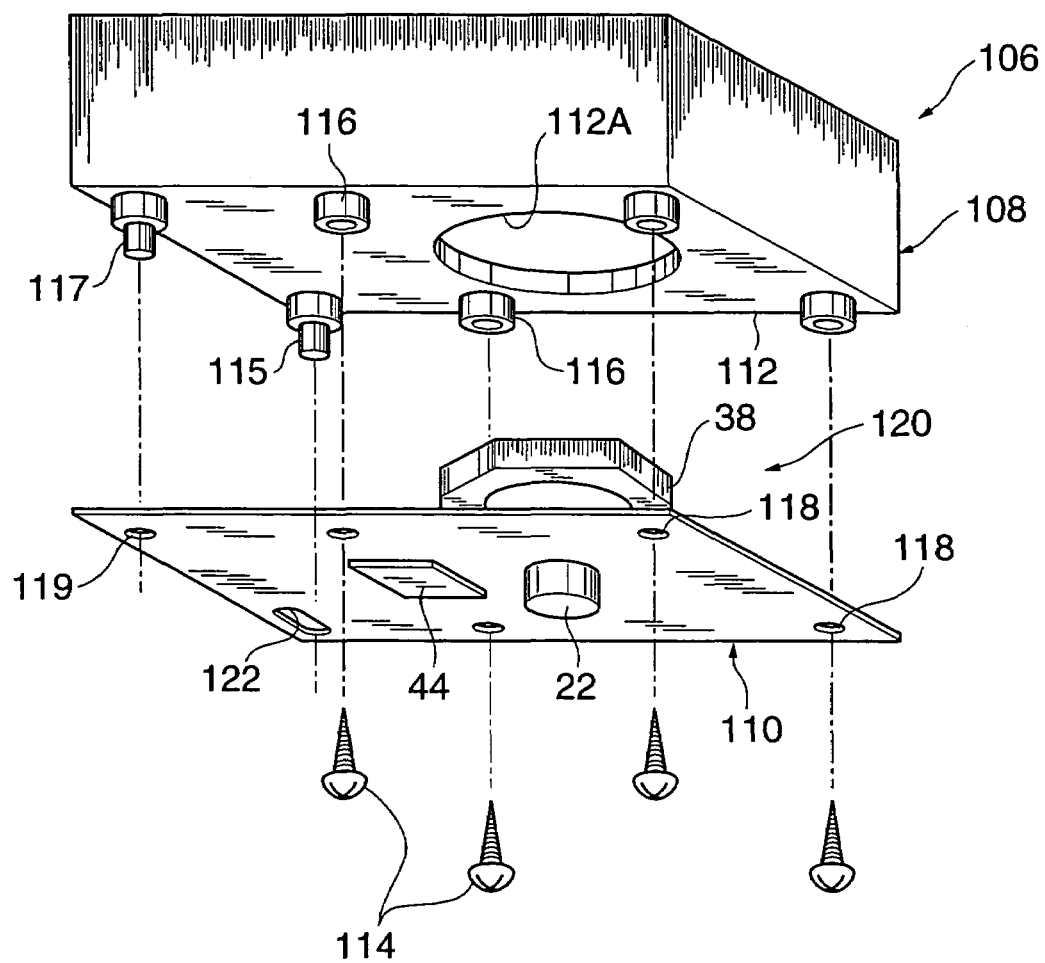
FIG. 12 is an exploded perspective view showing the optical scanner according to the fourth embodiment of the present invention, and a printed board constituting a bottom wall of the optical scanner.

As shown in FIGS. 11 and 12, the bottom wall of a housing 108 of an optical scanner 106 is configured with a printed board 110. A mounting plate 112 is provided in parallel with a cover 106A of the housing 108 in a lower position of the housing 108, and the printed board 110 is secured to the mounting plate 112. The mounting plate 112 is provided with an passage hole 112A whose size allows the passage of the rotating body 38, and from the lower face of the mounting plate 112, plural bosses 116 to which mounting screws 114 can be screwed are downward projected on the periphery of the passage hole 112A.

The printed board 110 is provided with holes 118 corresponding to the bosses 116 to allow the passage of the mounting screws 114. The rotating body 38 is installed in the printed board 110 and passed through the passage hole 112A.

Figure 13:
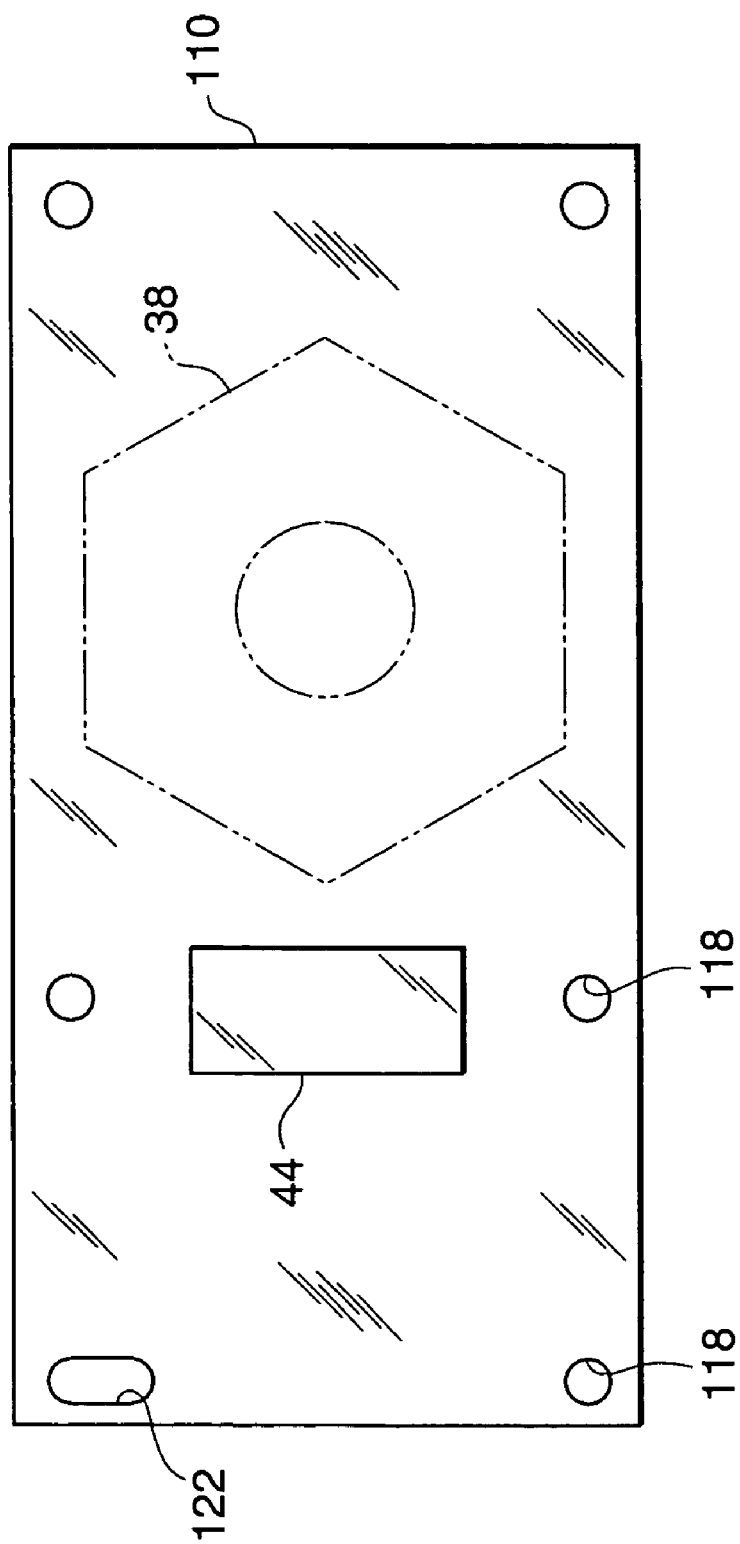
FIG. 13 is a back view showing the printed board constituting the bottom wall of the optical scanner according to the fourth embodiment of the present invention.

As shown in FIGS. 12 and 13, a hole 119 and a long hole 122 are provided in ends distant from an optical deflector 120 of the printed board 110, and the mounting plate 112 are provided with pins 115 and 117 corresponding to the hole 119 and the long hole 122.

When the rotating body 38 is passed through the through hole 112A and the printed board 110 is secured to the mounting plate 112, the printed board 110 is positioned by the optical deflector 120, and the pins 115 and 117. In this case, positional mismatch between the mounting plate 112 and the printed board 110 in a horizontal direction is accommodated by the long hole 122 and the pin 115.

The printed board 110 is brought into contact with the boss 116 of the mounting plate 112 and secured to the mounting plate 112 by the mounting screws 114, whereby the optical deflector 120 is positioned in a height direction with respect to the optical scanner 106.

By the way, as shown in FIG. 11, the metallic printed board 110 is secured so that a wiring pattern part 110A is on the opposite side of the rotating body 38. In other words, since the rotating body 38 is disposed in an upper position of the printed board 110, the wiring pattern part 110A is disposed on the lower face of the printed board 110. With this construction, the integrated circuit 44 and other electronic parts are mounted on the lower face of the printed board 110.

Since an exciting current flow through the drive coils 36 through the wiring pattern part 110A formed on the printed board 110, the drive coils 36 and the wiring pattern part 110A must be connected by a signal line 124.

Figure 14A:
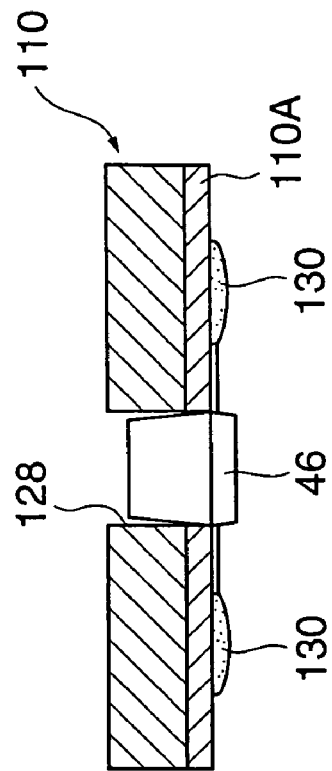
FIG. 14A is a sectional view showing connection of a signal line.

Therefore, as shown in FIGS. 11 and 14A, a circular connection hole 111 is formed in the printed board 110, and the wiring pattern part 110A formed on the lower face of the printed board 110 and the driving coils 36 on the upper face of the printed board 110 are connected by the signal line 124. An insulating member 126 is fixed to the circumferential edge of the connection hole 111 to maintain an insulation state between the connection hole 111 and the signal line 124.

Since an exciting current based on a signal from the Hall device 46 detecting the position of the rotating body 38 passes through the driving coils 36, like the driving coils 36, the Hall device 46 must also be connected with the wiring pattern part 110A of the printed board 110.

Figure 14B:
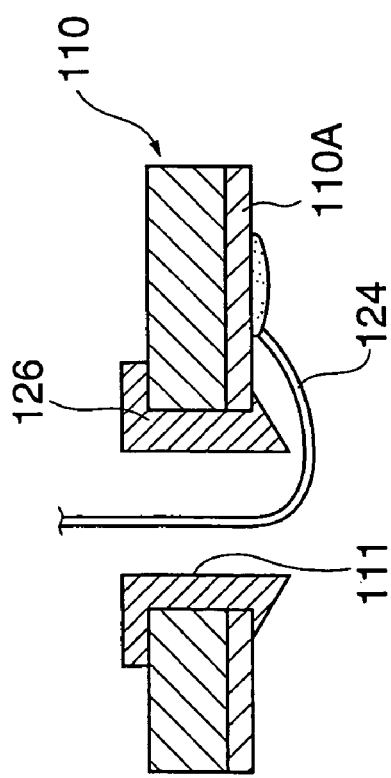
FIG. 14B is a sectional view showing connection of a Hall device.

Therefore, as shown in FIG. 14B, a hole is formed in the printed board 110, and the Hall device 46 is formed within the hole 128. The Hall device 46 and the wiring pattern part 110A are connected by solder 130. The Hall device 46 is fitted in the hole 128, which has almost the same size as the Hall device 46.

The following describes the operation of the optical scanner of the fourth embodiment of the present invention.

As shown in FIG. 11, in the printed board 110, the integrated circuit 44 and other electronic parts are mounted on a side opposite to the side in which the polygon mirror 28 is disposed. With this construction, the periphery of the motor 32 becomes flattened on the side of the polygon mirror 28 of the printed board 110, so that wind sound generated when wind generated by the rotation of the polygon mirror 28 hits the integrated circuit 44 and other electronic parts is weakened.

By mounting the integrated circuit 44 and other electronic parts outside the housing 108 of the optical scanner 106, heating sources of the optical deflector 120 are disposed outside the housing 108 of the optical scanner 106. As a result, a rise in the temperature of the housing 108 of the optical scanner 106 is reduced, and the integrated circuit 44 and other electronic parts can be directly cooled from outside the optical scanner 106.

By forming the hole 128 in the printed board 110 and disposing the Hall device 46 within the hole 128, the drive magnets 34 can be brought closer to the printed board 110 than when the Hall device 46 is disposed on the printed board 110. That is, the height of the optical deflector 120 can be reduced, and the optical deflector 120 and the optical scanner 106 can be made compact.

The hole 128 is formed so as to be substantially equal in size to the Hall device 46 and the Hall device 46 is fitted in the hole 128, whereby the accuracy of the disposition position of the Hall device 46 can be increased.

Since the wiring pattern part 110A of the printed board 110 is outside the housing 108, cables 132 for a power source and control signals can be directly connected to the external connection part 42 mounted on the wiring pattern part 110A. This eliminates the need for the relay cable 40 (see FIG. 1) for relaying from outside to inside the optical scanner 106 and the relay part 49 (see FIG. 1).

Figure 15:
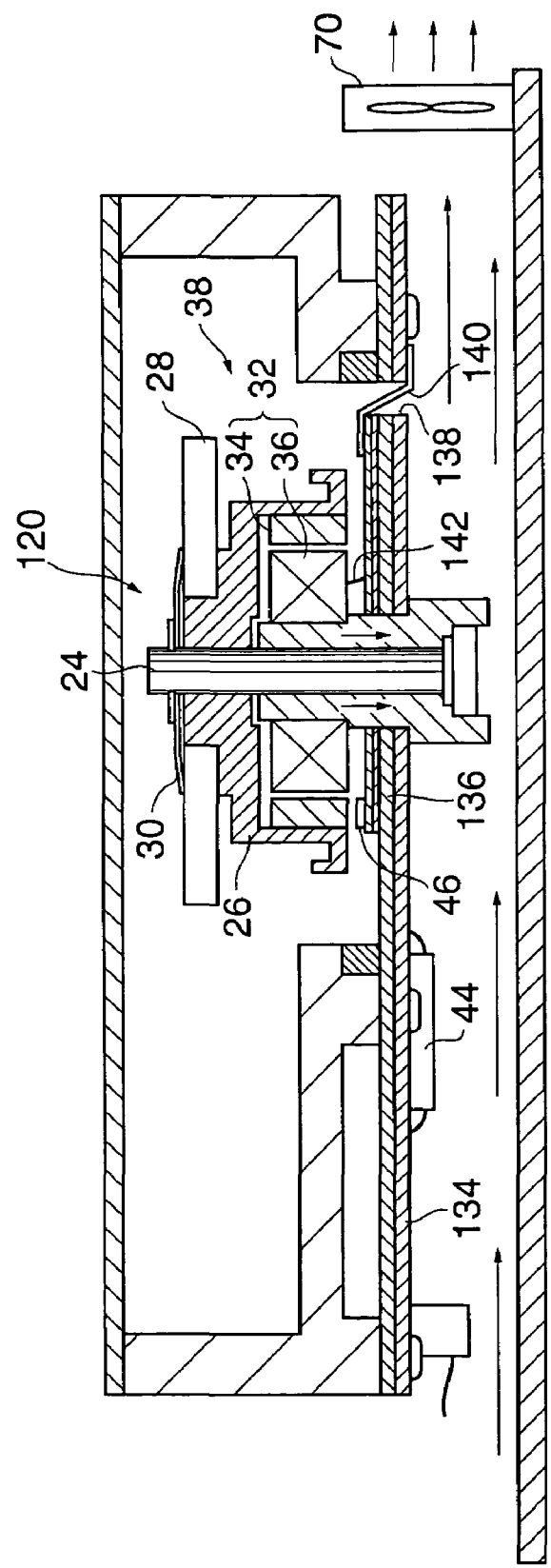
FIG. 15 is a sectional view showing another example of the optical scanner according to the fourth embodiment of the present invention.
Figure 18:
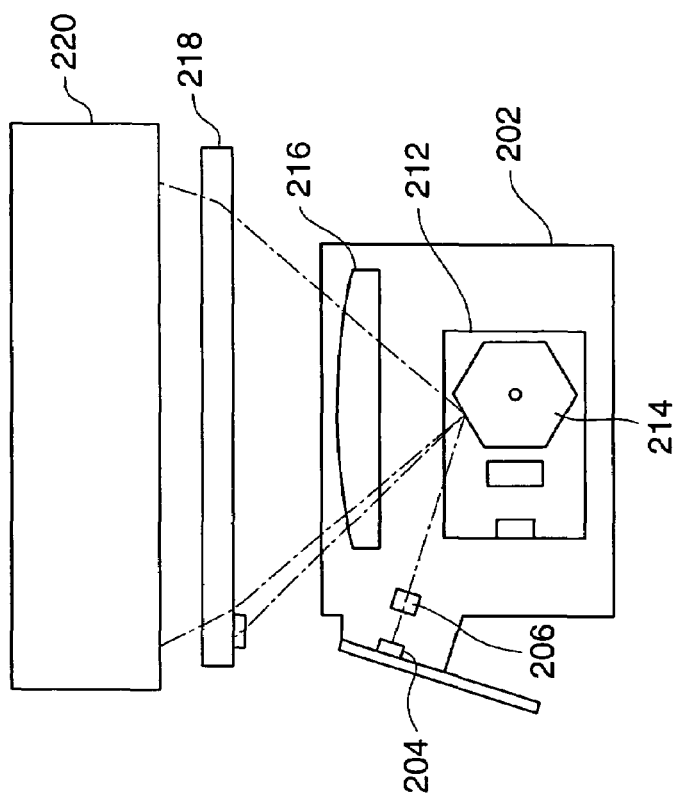
FIG. 18 illustrates an optical scanner.
Figure 17:
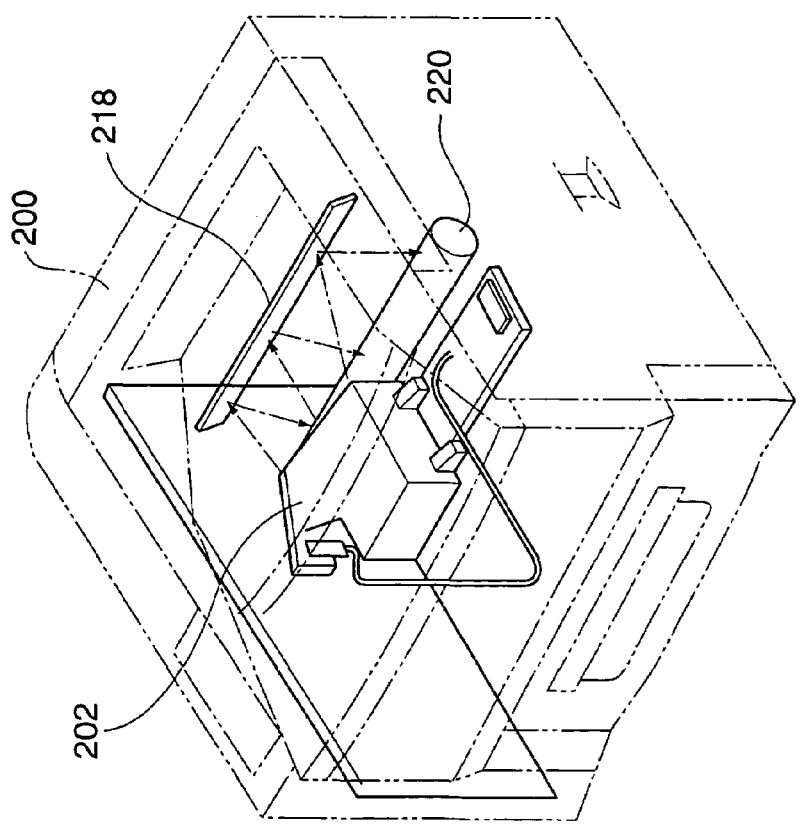
FIG. 17 is a perspective view of a general laser printer equipped with an optical scanner.
Figure 19:
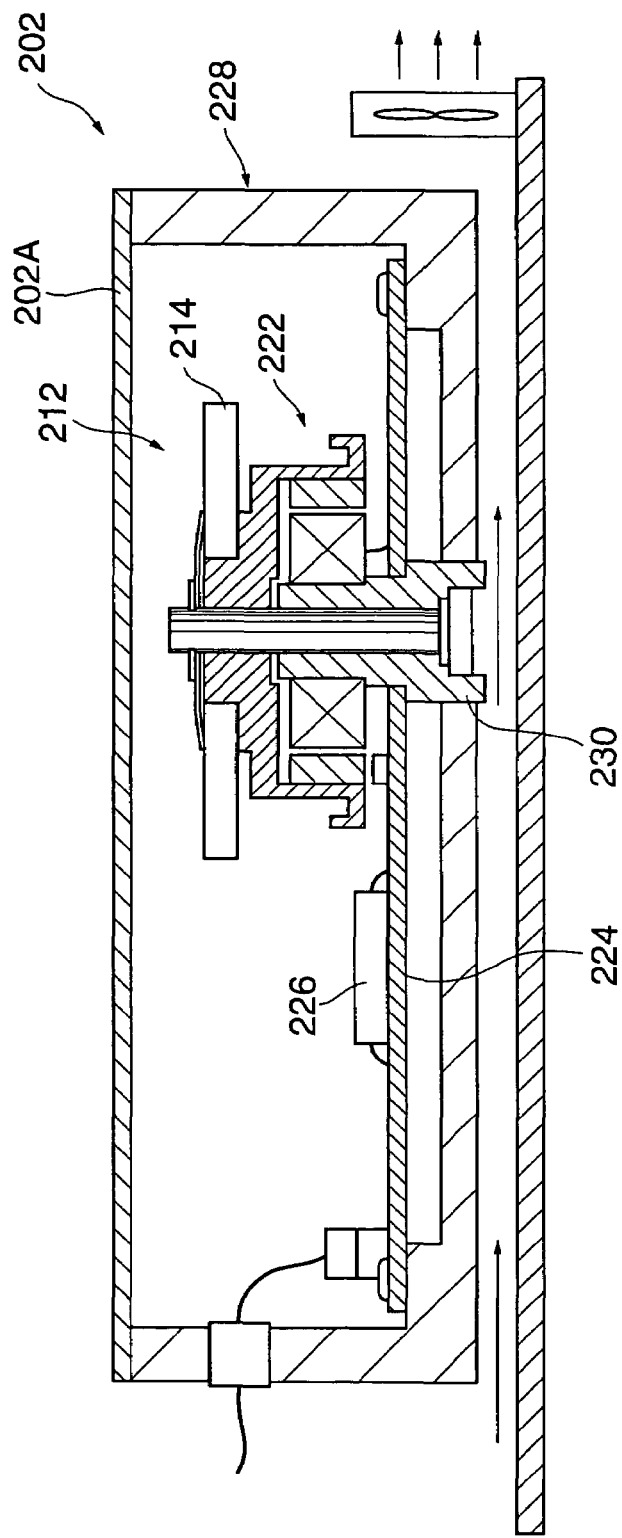
FIG. 19 is a sectional view showing a conventional optical scanner.

The present invention is not limited to the embodiment so long as the integrated circuit 44 is mounted outside the housing 108 of the optical scanner 106. For example, as shown in FIG. 15, a printed board 136 facing the drive magnets 34 and the drive coils 36 may be fixed to the upper face of a printed board 134, wherein the printed board 136 is smaller in area than a metallic printed board 134 and constructed from glass epoxy resin and paper phenol resin, or the like.

In this case, the printed board 134 is provided with a connection hole 138, and a wiring pattern of the printed board 134 and a wiring pattern of the printed board 136 are connected by an FFC (flexible flat cable) 140 through the connection hole 138.

The printed board 136 is provided with the Hall devices 46 in positions where they face the drive magnets 34, and the drive coils 36 and the wiring pattern of the printed board 136 are connected by a signal line 142.

As shown in FIG. 16, the following construction may also be used; that is, a metallic printed board 144 is provided with a hole 146, a printed board 148 on which the Hall device 46 can be mounted bridges the hole 146, the Hall device 46 is mounted on the printed board 148, and a wiring pattern of the printed board 148 and a wiring pattern of the printed board 144 are connected by an FFC 152. The printed board 144 is provided with a connection hole 154 to connect the drive coils 36 and a wiring pattern by a signal line 156.

Although the height of the optical deflector 120 can be reduced by thus disposing the Hall device 46 within the hole 146, there arises the problem of a tilt of the Hall device 46 in a height direction of the optical deflector 120 and the like. Accordingly, if the Hall device 46 is disposed in the printed board 144, there is no possibility that it is disposed on the tilt in the height direction of the optical deflector 120.

Since the present invention has the above-described construction, according to an aspect of the present invention, by forming the first through hole in the lower face of the electronic part, heat of the lower face of the electronic part can be expelled. By bringing the radiating member into contact with the electronic part through the first through hole, heat of the electronic part can be conducted to the radiating member through which the heat of the electronic part can be radiated. Furthermore, since the radiating member is brought into contact with the electronic part through the first through hole formed on the lower face of the integrated circuit, the radiating member is not exposed to an upper portion of a drive circuit board, that is, a side in which a rotative polygon mirror is disposed. Therefore, bringing the radiating member into contact with the electronic part does not result in increased wind sound generated during the rotation of the rotative polygon mirror.

According to another aspect of the present invention, heat generated by a motor can be conducted to the radiating member through the drive circuit board through which the heat can be radiated. According to another aspect of the present invention, the periphery of the motor becomes flattened on the side of the rotative polygon mirror of the drive circuit board, so that wind sound generated when wind generated by the rotation of the polygon mirror 28 hits electronic parts is weakened.

According to another aspect of the present invention, a connection hole is formed in the drive circuit board, and drive coils and a wiring pattern are electrically connected through the connection hole. According to another aspect of the present invention, the height of an optical deflector can be reduced, so that the optical deflector can be made more compact.

According to another aspect of the present invention, by providing the drive circuit board with a connection hole, a first wiring pattern and a second wiring pattern can be electrically connected. According to another aspect of the present invention, by bridging a hole by a subboard and disposing a position detector on the subboard, there is no possibility that the position detector is disposed on the tilt in the height direction of the optical scanner.

According to another aspect of the present invention, by bringing the radiating member into contact with the electronic part through the first through hole, heat of the electronic part can be conducted to the radiating member through which the heat of the electronic part can be radiated. By forming the first through hole on the lower face of the integrated circuit as the electronic part and bringing the radiating member into contact with the integrated circuit through the first through hole, a rise in the temperature of the housing can be reduced. As a result, the life of a bearing constituting the motor can be prolonged and the reliability of the integrated circuit can be increased. Since the radiating member is brought into direct contact with the integrated circuit, the radiation efficiency of the integrated circuit is excellent.

According to another aspect of the present invention, since the housing of the optical scanner is constructed so as to serve as a radiating member, heat generated by the electronic part is radiated to the outside through the housing. Since heat of the housing generated by the motor can be radiated through the housing via the drive circuit board, a rise in the temperature of the electronic part and the housing can be reduced without using a special radiating member. Furthermore, by providing a cooling unit outside the optical scanner, the temperature in the integrated circuit and inside of the housing can be further reduced.

According to another aspect of the present invention, by exposing the radiating member outside the housing of the optical scanner, heat generated from the electronic part and the motor can be radiated outside the housing of the optical scanner through the radiating member, so that a rise in the temperature of the optical scanner can be reduced. By thus reducing a rise in the temperature of the housing of the optical scanner, the reliability of the bearing and the drive circuit can be increased.

According to another aspect of the present invention, by mounting the electronic part outside the housing of the optical scanner, a heating source of the optical deflector is disposed outside the housing of the optical scanner, so that a rise in the temperature of the housing of the optical scanner is reduced and the electronic part can be cooled directly from outside the optical scanner. By disposing a connection part for connecting cables for a power source and control signals outside the housing, the cables can be directly connected, so that a relay cable for relaying from inside to outside the optical scanner is not required.

The entire disclosure of Japanese Patent Application No. 2003-075803 filed on Mar. 19, 2003 including specification, claims, drawings and abstract is incorporated herein by reference in its entirety.

What is claimed is:

1. An optical deflector comprising:
   a motor that drives a rotative polygon mirror deflecting rays emitted from a light source;
   a drive circuit board, mounted in a housing, on which an electronic part controlling the motor is mounted;
   a first through hole on a lover face of the electronic part, formed on the drive circuit board; and a radiating member that, through the first through hole, directly contacts the electronic part or indirectly contacts the electronic part through an intervening conductive member.

2. The optical deflector according to claim 1, wherein the drive circuit board is constructed from a metal and the radiating member contacts the drive circuit board.

3. An optical scanner comprising:
an optical deflector comprising:
a motor that drives a rotative polygon mirror deflecting rays emitted from a light source;
a drive circuit board, mounted in a housing, on which an electronic part controlling the motor is mounted;
a first through hole on a lower face of the electronic part, formed on the drive circuit board; and
a radiating member that, through the first through hole, directly contacts the electronic part or indirectly contacts the electronic part through an intervening conductive member.

4. The optical scanner according to claim 3, wherein the housing is constructed from a metal, and the housing is the radiating member.

5. The optical scanner according to claim 3, wherein a second through hole is provided on a bottom wall of the housing for being communicated with the first thorough hole, and the radiating member is exposed to outside the housing.

* * * * *